United States Patent
Simonin

(10) Patent No.: US 10,158,059 B2
(45) Date of Patent: Dec. 18, 2018

(54) FLOW CONTROL DEVICE TO BE USED IN A THERMOELECTRIC GENERATOR AND A THERMOELECTRIC GENERATOR COMPRISING SUCH A DEVICE

(71) Applicants: Valeo Systemes Thermiques, Le Mesnil Saint Denis (FR); Michel Simonin, Voisins-le-Bretonneux (FR)

(72) Inventor: Michel Simonin, Voisins-le-Bretonneux (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 353 days.

(21) Appl. No.: 14/734,855

(22) Filed: Jun. 9, 2015

(65) Prior Publication Data

US 2015/0357544 A1  Dec. 10, 2015

(30) Foreign Application Priority Data

Jun. 10, 2014 (FR) ..................... 14 55215

(51) Int. Cl.
*H01L 35/32* (2006.01)
*H01L 35/30* (2006.01)
*F01N 5/02* (2006.01)

(52) U.S. Cl.
CPC .............. *H01L 35/30* (2013.01); *F01N 5/025* (2013.01); *H01L 35/32* (2013.01);
(Continued)

(58) Field of Classification Search
CPC ......... H01L 35/30; H01L 35/32; F01N 5/025; F01N 2240/20; F01N 2410/00; F01N 2240/36; Y02T 10/16
See application file for complete search history.

(56) References Cited

U.S. PATENT DOCUMENTS

| 6,702,190 B1 * | 3/2004 | Nohl | B60H 1/025 165/41 |
| 2014/0033703 A1 * | 2/2014 | Limbeck | F01N 3/043 60/597 |

FOREIGN PATENT DOCUMENTS

| DE | 10 2011 016 808 A1 | 10/2012 |
| EP | 2 381 083 A1 | 10/2011 |

(Continued)

OTHER PUBLICATIONS

French Preliminary Search Report for Application FR 1455215 dated Oct. 31, 2014, 2 pages.
(Continued)

*Primary Examiner* — Devina Pillay
(74) *Attorney, Agent, or Firm* — Howard & Howard Attorneys PLLC

(57) ABSTRACT

The invention relates to a flow control device intended to be used in a thermoelectric generator (10), said generator (10) allowing a temperature gradient to be created between a cold source and a heat source in at least two zones (A, B), characterized in that it comprises a valve (30), said valve (30) comprising a valve body (32) and a gate (34), said gate (34) being hinged relative to the valve body (32) and being capable of occupying an open position and a closed position, said valve (30) being configured to be positioned inside said generator (10), between said two zones (A, B), so as to modulate the quantity of a first fluid circulating through said thermoelectric generator (10). The invention further relates to a thermoelectric generator (10) comprising such a device.

13 Claims, 3 Drawing Sheets

(52) U.S. Cl.
CPC ...... *F01N 2240/20* (2013.01); *F01N 2410/00* (2013.01); *Y02T 10/16* (2013.01)

(56) References Cited

FOREIGN PATENT DOCUMENTS

JP         2008-274790 A    11/2008
WO    WO 2011/011795 A2    1/2011

OTHER PUBLICATIONS

Machine-assisted English language abstract for DE 10 2011 016 808 extracted from espacenet.com database on Jun. 29, 2015, 2 pages.
English language abstract and machine-assisted English translation for JP 2008-274790 extracted from espacenet.com database on Jun. 29, 2015, 25 pages.

* cited by examiner

FLOW CONTROL DEVICE TO BE USED IN A THERMOELECTRIC GENERATOR AND A THERMOELECTRIC GENERATOR COMPRISING SUCH A DEVICE

RELATED APPLICATIONS

This application claims priority to and all the advantages of French Patent Application No. FR 14/55215, filed on Jun. 10, 2014, the content of which is herein incorporated by reference.

The invention relates to a flow control device intended to be used in a thermoelectric generator and to a thermoelectric generator comprising such a device.

BACKGROUND

In the automotive field, thermoelectric devices have already been proposed that use elements, called thermoelectric elements, allowing an electric current to be generated when a temperature gradient is present between two of their opposite faces, according to the phenomenon known as the Seebeck effect. These devices are also called thermoelectric generators.

It is known for these thermoelectric generators to be positioned in an exhaust line of a motor vehicle or even in the recirculated exhaust gas circuit of motor vehicles with such a circuit between the exhaust and the intake of the heat engine. The object is to use the heat of the exhaust gases of motor vehicles to generate electrical energy.

There is a requirement for the flow of exhaust gases to be controlled in order to promote the proper functioning of the engine and to optimise the performance of said thermoelectric generators.

SUMMARY OF THE INVENTION

Therefore, the invention relates to a flow control device intended to be used in a thermoelectric generator, said generator allowing a temperature gradient to be created between a cold source and a heat source in at least two zones.

According to the invention, said flow control device comprises a valve, said valve comprising a valve body and a gate, said gate being hinged relative to the valve body and being capable of occupying an open position and a closed position, said valve being configured to be positioned inside said generator, between said two zones, so as to modulate the quantity of a first fluid circulating through said thermoelectric generator.

By virtue of such a control device, the invention allows the flow of the exhaust gases through the generator and the associated load losses to be modulated.

Furthermore, the control device according to the invention allows its installation to be simplified. Indeed, as it is integrated within the thermoelectric generator, it no longer needs to be installed upstream or downstream of said generator.

According to various embodiments of the invention, which can be taken separately or in combination:

the device according to the invention is configured so that the first fluid is the heat source of said generator;
said valve body comprises first openings on its periphery;
said body is configured so that said first fluid circulates through said first openings when the gate occupies the closed position;
said first fluid is a hot gas;
said valve body comprises second openings on its periphery, the second openings being distinct from said first openings;
said body is configured so that a second fluid forming the cold source circulates through said second openings, whether the valve occupies its open position or its closed position;
said second fluid is a coolant;
said valve body comprises a central hole, which may or may not be open depending on the position of the gate;
said gate comprises a flap and a drive axis for said flap;
said body comprises a hinge support for said drive axis.

The invention further relates to a thermoelectric generator comprising a device as described above.

In other words, said generator comprises two zones that each allow a temperature gradient to be created between a cold source and a heat source and said device is located between said two zones.

According to various embodiments of the invention, which can be taken separately or in combination:

the thermoelectric generator according to the invention comprises a bundle of thermoelectric modules, said bundle being tubular so as to internally define a flow pipe for said first fluid through said valve body in the open position of said gate so as to allow said fluid to circulate through said generator, whilst avoiding passing through said bundle;
said modules comprise at least one annular thermoelectric element, capable of generating an electric current under the effect of said temperature gradient, provided between two of its faces, one face, called the first face, being defined by an outer peripheral surface and the other face, called the second face, being defined by an inner peripheral surface;
said bundle has a substantially circular section, said valve being configured to radially divert said first fluid through the bundle, from the inside to the outside of said pipe;
the thermoelectric generator according to the invention comprises a housing configured to guide, in particular in an axial manner, said first fluid through said valve body between said bundle and a wall of said housing;
said housing is configured to radially guide said first fluid downstream of the valve, from the outside to the inside of said pipe;
said generator comprises tubes for circulating the second fluid passing through said second openings of the body of the control device;
said tubes for circulating the second fluid pass through said thermoelectric elements and are configured to be in a heat exchange relationship with their inner peripheral surface;
the thermoelectric generator according to the invention comprises first secondary exchange surfaces with the first fluid, said first secondary exchange surfaces being fins that link the modules together;
the fins comprise a catalytic coating for providing a catalytic conversion of toxic components of the first fluid;
the thermoelectric generator according to the invention is configured to be positioned in an exhaust line of a motor vehicle so that the exhaust gases circulating in said line define said first fluid and/or in a recirculated exhaust gas circuit of a motor vehicle so that said recirculated exhaust gases circulating in said circuit define said first fluid.

BRIEF DESCRIPTION OF THE DRAWINGS

The invention will be better understood and further objects, details, features and advantages of the invention will become apparent throughout the following detailed description of at least one embodiment of the invention, which is provided solely by way of illustration and non-limiting example, with reference to the accompanying schematic drawings, in which.

DETAILED DESCRIPTION

Figure 1:
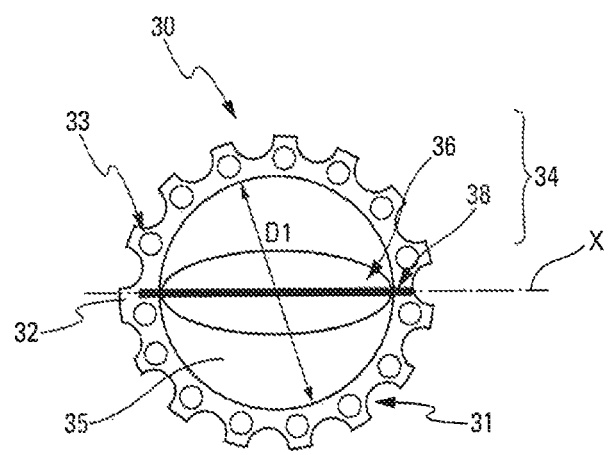
FIG. 1 is a schematic view in elevation of a valve according to the invention.

As shown in FIG. 1, the invention relates to a flow control device intended to be used in a thermoelectric generator. FIGS. 2 to 5 schematically show a thermoelectric generator 10 according to the invention, in particular when it is mounted in series between a heat engine (not shown) and a catalytic system 20.

By way of example, the thermoelectric generator 10 according to the invention is configured to be positioned in an exhaust line of a motor vehicle and/or in a recirculated exhaust gas circuit of a motor vehicle.

The catalytic system 20, shown herein by way of example, controls the emission of exhaust gases out of the motor vehicle; as the invention does not relate to its operation, it will not be described.

The thermoelectric generator 10 comprises thermoelectric modules that are capable of generating electricity when one of their faces is in contact with a cold source and when a second one of their faces is in contact with a heat source. The exhaust gases of said motor vehicle in this case are used as a heat source by the generator 10 in order to generate a temperature gradient with the cold source.

The purpose of the flow control device according to the invention is to modulate the flow of said exhaust gases, or heat source, through said generator 10.

Therefore, the flow control device according to the invention comprises a valve 30 (shown in detail in FIG. 1).

Said valve 30 comprises a valve body 32 and a gate 34. The valve body 32 comprises a central hole 35, which may or may not be open depending on the position of the gate 34. Indeed, said gate 34 comprises a flap 36 and a drive axis X for said flap. In other words, the gate 34 is hinged relative to the valve body 32. The drive axis, provided with reference numeral X in FIGS. 1 to 5, is hinged via a hinge support 38 on the body 32.

Figure 3:
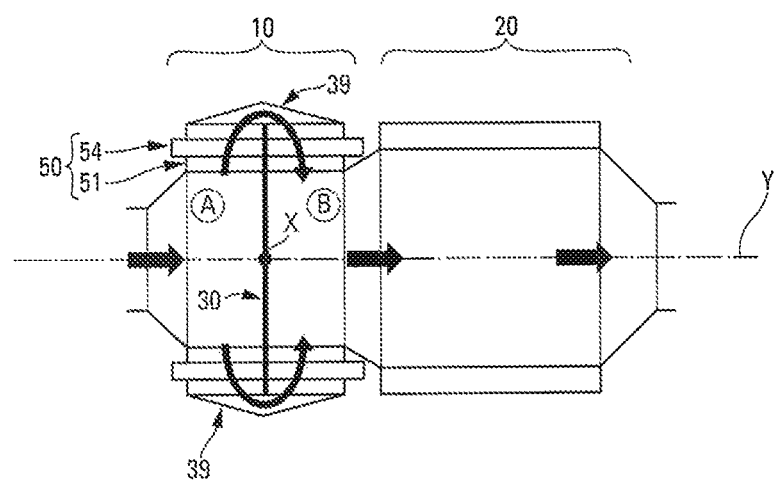
FIG. 3 is a similar representation to that of FIG. 2, with the valve being closed.
Figure 4:
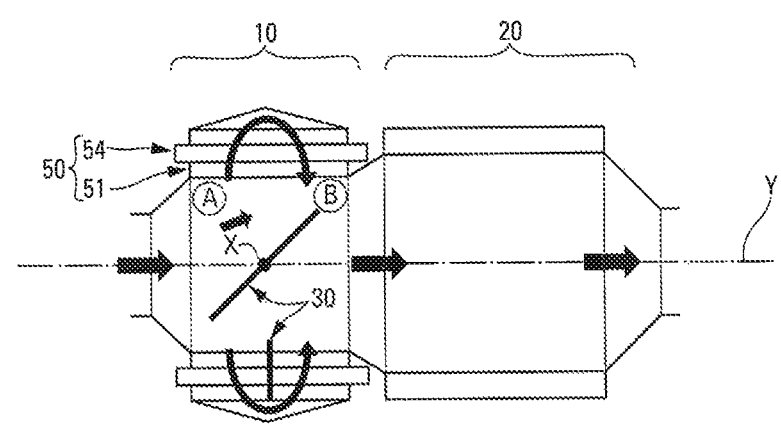
FIG. 4 is a similar representation to that of FIG. 2, with the valve occupying an intermediate position between its open position and its closed position.

Therefore, the valve 30 is capable of occupying an open position (see FIGS. 2 and 5), a closed position (see FIG. 3) or an intermediate position (see FIG. 4). To this end, the device can comprise means for actuating the flap (not shown) that are integrated in the generator, for example. Advantageously, they are configured to allow said flap to occupy any angular position.

According to the invention, said valve is configured to be inside said generator 10, between two zones A, B, which allows the control device to be highly integrated inside the generator 10.

The path of said gases is shown by straight and/or curved arrows in FIGS. 2 to 5. The straight arrows represent a gas flow along the axis of the generator 10 and of the catalytic system 20, called the main axis and provided with reference numeral Y in the figures. The curved arrows represent a flow, referred to as a radial flow, about an axis co-linear to the axis Y, particularly in the region of the bundle 50 described hereafter. Schematically, a significant flow has been shown using thicker arrows.

As stated above, the thermoelectric generator 10 comprises a bundle 50 of thermoelectric modules.

Said modules comprise at least one thermoelectric element 51, in this case of annular shape. When coaxially assembled, these thermoelectric elements 51 form thermoelectric rods 51. Said thermoelectric elements 51 and, consequently, said thermoelectric rods 51 are capable of generating an electric current under the effect of a temperature gradient. For this reason, the centres of the thermoelectric rods 51 comprise tubes 54, through which a coolant fluid circulates that acts as a cold source.

The thermoelectric modules can further comprise fins (not shown) that are preferably metal. The fins act as secondary exchange surfaces with the hot gases. Advantageously, said fins are configured to link the thermoelectric modules together. Furthermore, they can comprise a catalytic coating for providing a catalytic conversion of toxic components of the hot gases.

Therefore, the thermoelectric modules comprise at least one thermoelectric element 51, in this case a plurality of annular thermoelectric elements 51, capable of generating an electric current under the effect of a temperature gradient exerted between two of its faces, one face, called the first face, being defined by a cylindrical outer peripheral surface and the other face, called the second face, being defined by a cylindrical inner peripheral surface.

Said first and second faces are, for example, of oval section for the first faces and/or of circular section for the second faces. More generally, any round and/or polygon-shaped section is possible.

Such elements 51 operate, according to the Seebeck effect, by allowing an electric current to be generated in a charge connected between said faces that are subject to the temperature gradient. In a manner known to a person skilled in the art, such elements 51 are made up of bismuth and tellurium ($Bi_2Te_3$), for example.

The first part of the thermoelectric elements 51 can be elements of a first type, called P elements, allowing a difference in electric potential to be established in one direction, called the positive direction, when they are subject to a given temperature gradient, and the other part can be elements of a second type, called N elements, allowing a difference in electric potential to be created in an opposite direction, called the negative direction, when they are subject to the same temperature gradient.

The thermoelectric elements 51 are formed by a one-piece ring. Nevertheless, they can be formed by a plurality of parts each forming an angular portion of the ring.

The first surface has, for example, a radius that is between 1.5 and 4 times the radius of the second surface. It can have a radius equal to approximately two times that of the second surface.

Said thermoelectric element 51 has, for example, two opposite, parallel flat faces. In other words, the ring forming the thermoelectric element 51 has a rectangular annular section.

Figure 6:
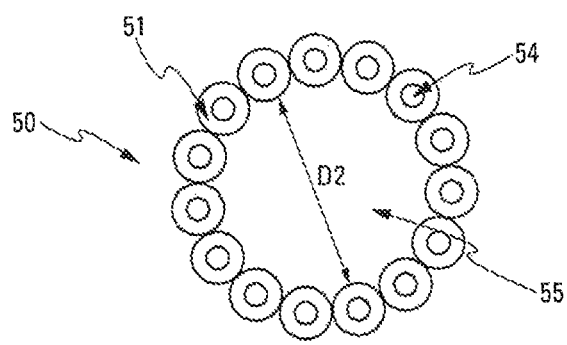
FIG. 6 is a schematic view in elevation of a bundle of thermoelectric modules of a thermoelectric generator according to the invention.

As shown in FIG. 6, the bundle 50 is tubular. It thus defines a flow pipe 55 for said gases. This flow pipe 55 is formed, inter alia, by said zones A, B. Therefore, when the valve 30 is open, the gases circulate through the part of the pipe that corresponds to said zone A, said valve 30 and the part of said pipe that corresponds to said zone B, with only a small fraction of said gases passing through the bundle 50.

The valve body 32 and the flow pipe 55 advantageously are coaxial. The diameter of the central hole 35 of the valve body 32, provided with reference numeral D1 in FIG. 1, is less than the distance D2 separating two diametrically opposed thermoelectric rods 51 of the bundle 50 (see FIG. 6).

Figure 2:
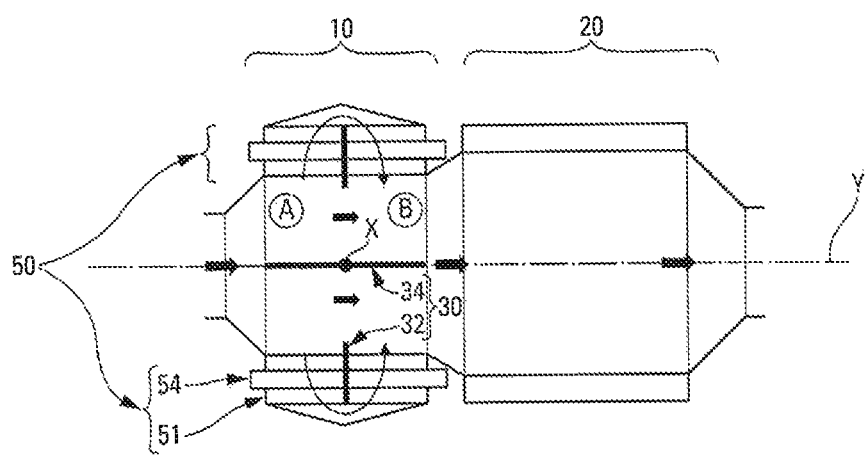
FIG. 2 is a schematic longitudinal section of a thermoelectric generator according to the invention when it is mounted in series between a heat engine (not shown) and a catalytic system, the heat engine being in the start-up phase and the valve of the invention being open.

FIG. 2 shows a configuration in which the valve 30 is open and only a small portion of the gases passes through the bundle 50. This case particularly occurs during start-up of the heat engine (engine not shown). The temperature of the gases is then lower than 400° C., for example, for a coolant with a temperature lower than 100° C., for example. It is to be noted that the fraction of the gases passing through the bundle promotes the transfer of the heat of the hot gases into the cold liquid during the engine start-up phases, which can help to accelerate its warming-up to nominal temperature.

Figure 5:
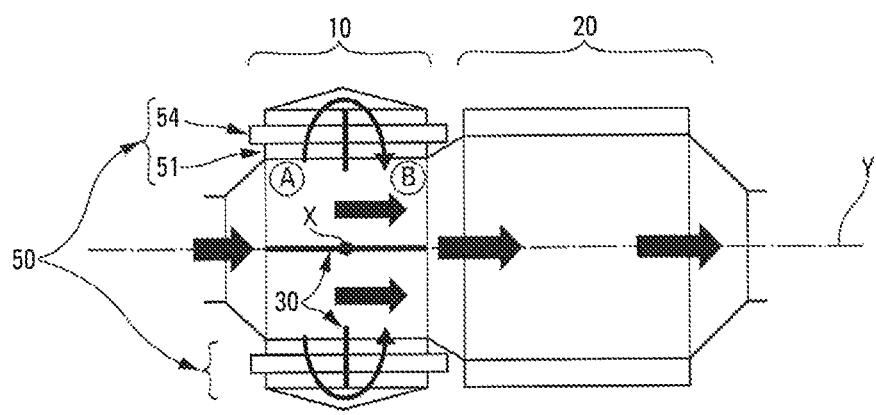
FIG. 5 is the same configuration as FIG. 2, with the heat engine being in a running phase following the start-up phase.

FIG. 5 shows a configuration similar to that of FIG. 2. As the engine is not in the start-up phase, the flow of the gases then can be quantified: this flow is higher than 70 g/s, for example. The temperature of the gases is then higher than 750° C., for example. This figure shows that the hot gases still avoid passing through the bundle 50.

Moreover, when the valve 30 is in the closed position (see FIG. 3), the gases are guided towards the bundle 50, which they pass through in a radial manner. Said gases are then guided, in particular in an axial manner, through recesses 31 made on the periphery of said valve body 32. More specifically, a housing 39 is placed around said bundle and said valve body 32 to guide said gases, between the bundle 50 and a wall of the housing 39, through the first openings 31. In zone A, upstream of the valve 30, the gas circulates through the bundle 50, from the inside to the outside of the pipe. In zone B, downstream of the valve 30, the gases are radially guided by the housing 39, from the outside to the inside.

This configuration, shown in FIG. 3, is more particularly suitable for exhaust gas flows that are lower than that stated with reference to FIG. 5. Said flow will be lower than 30 g/s, for example, for a gas temperature lower than 750° C., for example.

FIG. 4 shows an intermediate configuration, with a valve 30 position that modifies the axial circulation of the gases without forcing them to fully circulate through the bundle 50.

This configuration is more particularly suited to gas flows and is, for example, higher than 30 g/s for a temperature lower than 750° C., for example.

It is to be noted that second openings 33 allow the coolant to circulate through the valve body 32, regardless of the open or closed position of the valve 30.

These openings also allow the valve body 32 that supports the gate 34 to be brought into contact with at least one or more of the tube(s) 54 through which the coolant circulates. This has the advantage of cooling the gate 34, particularly in the region of its hinge supports 38, and therefore of keeping said gate 34 at a temperature lower than that of the exhaust gases. In other words, this condition is advantageous for preventing the overheating of the hinge supports 38 that support said gate 34.

It is to be noted that variants are indeed possible. In particular, in an additional embodiment (not shown), such a valve 30 can be configured to be positioned in a heat exchanger, whilst disregarding the thermoelectric modules inserted between the coolant tubes and the fins.

The invention claimed is:

1. A thermoelectric generator comprising a flow control device, said generator allowing a temperature gradient to be created between a cold source and a heat source in at least two zones A and B defined inside the thermoelectric generator, wherein the flow control device comprises a valve, said valve comprising a valve body and a gate, said gate being hinged relative to said valve body and being capable of occupying an open position and a closed position, said valve being positioned inside said generator and in the middle of said generator, between said two zones A and B, so as to modulate the quantity of a first fluid circulating through said thermoelectric generator, said thermoelectric generator comprising a bundle of thermoelectric modules, said bundle being tubular so as to internally define a central flow pipe for said first fluid through said valve body, said valve being configured to radially divert at least a part of the first fluid, circulating in the central flow pipe in zone A, towards and through said bundle, said thermoelectric generator further comprising a housing arranged around the bundle and configured to radially divert the first fluid towards zone B in the central flow pipe, wherein said valve body comprises first openings on its periphery, and wherein said valve body is configured so that the first fluid circulates through said first openings when said gate occupies the closed position.

2. A thermoelectric generator according to claim 1, configured so that the first fluid is the heat source of said generator.

3. A thermoelectric generator according to claim 1, configured to be positioned in an exhaust line of a motor vehicle so that the exhaust gases circulating in said line define said first fluid and/or in a recirculated exhaust gas circuit of a motor vehicle so that said recirculated exhaust gases circulating in said circuit define said first fluid.

4. A thermoelectric generator according to claim 1, wherein said valve body comprises second openings on its periphery, said second openings being distinct from said first openings.

5. A thermoelectric generator according to claim 4, wherein said body is configured so that a second fluid forming said cold source circulates through said second openings, whether the valve occupies its open position or its closed position.

6. A thermoelectric generator according to claim 1, said bundle being tubular so as to internally define a flow pipe for said first fluid through said valve body in the open position of said gate so as to allow said fluid to circulate through said generator whilst avoiding passing through said bundle.

7. A thermoelectric generator according to claim 6, wherein said modules comprise at least one annular thermoelectric element capable of generating an electric current under the effect of said temperature gradient that is applied between two of its faces, one face, called the first face, being defined by an outer peripheral surface and the other face, called the second face, being defined by an inner peripheral surface.

8. A thermoelectric generator according to claim 6, wherein said bundle has a substantially circular section, said valve being configured to radially divert said first fluid through the bundle, from the inside to the outside of said pipe.

9. A thermoelectric generator according to claim 6, wherein said housing is configured to guide said first fluid through said valve body between said bundle and a wall of said housing.

10. A thermoelectric generator according to claim 9, wherein said housing is configured to radially guide said first fluid downstream of the valve, from the outside to the inside of said pipe.

11. A thermoelectric generator according to claim 6, comprising first secondary exchange surfaces with the first fluid, said first secondary exchange surfaces being fins that link the modules together.

12. A thermoelectric generator according to claim 11, wherein said fins comprise a catalytic coating for providing a catalytic conversion of toxic components of the first fluid.

13. A thermoelectric generator comprising a flow control device, said generator allowing a temperature gradient to be created between a cold source and a heat source in at least two zones A and B defined inside the thermoelectric generator, wherein the flow control device comprises a valve, said valve comprising a valve body and a gate, said gate being hinged relative to the valve body and being capable of occupying an open position and a closed position, said valve being positioned inside said generator and in the middle of said generator, between said two zones A and B, so as to modulate the quantity of a first fluid circulating through said thermoelectric generator, said thermoelectric generator comprising a bundle of thermoelectric modules, said bundle being tubular so as to internally define a central flow pipe for said first fluid through said valve body, said valve being configured to radially divert at least a part of the first fluid, circulating in the central flow pipe in zone A, towards and through said bundle, said thermoelectric generator further comprising a housing arranged around the bundle and configured to radially divert the first fluid towards zone B in the central flow pipe, wherein said valve body comprises first openings and second openings on its periphery, with said second openings being distinct from said first openings, and wherein said body is configured so that a second fluid forming said cold source circulates through said second openings, whether the valve occupies its open position or its closed position.

* * * * *